(12) United States Patent
Lal

(10) Patent No.: US 12,325,626 B2
(45) Date of Patent: Jun. 10, 2025

(54) MICROELECTROMECHANICAL SYSTEMS (MEMS) RECTIFIER AND STORAGE ELEMENT FOR ENERGY HARVESTING

(71) Applicant: CHORUSVIEW, INC., Las Vegas, NV (US)

(72) Inventor: Amit Lal, Ithaca, NY (US)

(73) Assignee: CHORUSVIEW, INC., Las Vegas, NV (US)

( * ) Notice: Subject to any disclaimer, the term of this patent is extended or adjusted under 35 U.S.C. 154(b) by 0 days.

(21) Appl. No.: 18/514,346

(22) Filed: Nov. 20, 2023

(65) Prior Publication Data

US 2024/0166497 A1 May 23, 2024

Related U.S. Application Data

(63) Continuation of application No. 17/901,988, filed on Sep. 2, 2022, now Pat. No. 11,858,807.
(Continued)

(51) Int. Cl.
*B81B 7/00* (2006.01)
*B81B 3/00* (2006.01)
(Continued)

(52) U.S. Cl.
CPC .......... *B81B 7/0074* (2013.01); *B81B 3/0021* (2013.01); *H10N 30/85* (2023.02); *H04W 4/029* (2018.02)

(58) Field of Classification Search
CPC ........ H10N 30/85; H10N 30/40; H10N 30/06; H10N 30/87; H04W 4/029; H02N 2/188; H02N 2/186; B81B 7/0074; B81B 3/0021
See application file for complete search history.

(56) References Cited

U.S. PATENT DOCUMENTS 5,515,853 A * 5/1996 Smith .................... A61B 5/287
128/916
7,116,036 B2 10/2006 Balasubramaniam et al.
(Continued)

FOREIGN PATENT DOCUMENTS

WO 2005050717 A2 6/2005
WO 2021118120 A1 6/2021

OTHER PUBLICATIONS

Du et al. A nail-size Piezoelectric Energy Harvesting System Integrating a MEMS Transducer and a CMOS SSHI circuit, IEEE Sensor Journal—Sep. 2019 (Year: 2019).*
(Continued)

*Primary Examiner* — Galina G Yushina
(74) *Attorney, Agent, or Firm* — Botos Churchill IP Law

(57) ABSTRACT

An electronic device includes a microelectromechanical system (MEMS) rectifier. The MEMS rectifier includes a mainboard and a sub-board. The mainboard has one or more radiofrequency (RF) inputs configured to receive an RF signal, and a first electrical contact. The sub-board is positioned parallel to the mainboard with a gap in-between, and has a thin film piezoelectric layer, a second electrical contact positioned opposite the first electrical contact, and a ground plane. The sub-board is configured to vibrate as the RF signal is received at the one or more RF inputs, and the thin film piezoelectric layer is configured to generate energy due to the vibration and piezoelectric properties of the thin film piezoelectric layer.

20 Claims, 8 Drawing Sheets

Related U.S. Application Data

(60) Provisional application No. 63/273,525, filed on Oct. 29, 2021.

(51) Int. Cl.
  *H04W 4/029* (2018.01)
  *H10N 30/85* (2023.01)

(56) References Cited

U.S. PATENT DOCUMENTS

| | | | |
|---|---|---|---|
| 7,414,351 | B2 | 8/2008 | Ulm et al. |
| 7,554,425 | B2 | 6/2009 | Van et al. |
| 8,421,313 | B2 | 4/2013 | Shih et al. |
| 9,698,754 | B2 | 7/2017 | Burak |
| 9,780,698 | B2 | 10/2017 | Lee et al. |
| 10,952,029 | B1 | 3/2021 | Kawaguchi et al. |
| 2007/0125161 | A1* | 6/2007 | Bryzek ............ B81B 3/0086 73/146.4 |
| 2007/0229271 | A1* | 10/2007 | Shionoiri ........ G06K 19/0723 340/572.1 |
| 2008/0136292 | A1 | 6/2008 | Thiesen |
| 2010/0066496 | A1* | 3/2010 | Cho .................. H04Q 9/00 340/10.1 |
| 2014/0056043 | A1 | 2/2014 | Naito et al. |
| 2014/0355381 | A1 | 12/2014 | Lal et al. |
| 2016/0087186 | A1* | 3/2016 | Burak ............ H03H 9/02228 310/366 |
| 2016/0211826 | A1* | 7/2016 | Abdolvand ...... H03H 9/02244 |
| 2017/0026029 | A1* | 1/2017 | Bahai .................. H03H 9/205 |
| 2018/0309422 | A1* | 10/2018 | Shealy .............. H10N 30/877 |
| 2020/0297269 | A1* | 9/2020 | Vieri ................... H04L 63/12 |
| 2020/0321514 | A1 | 10/2020 | Sadr |

OTHER PUBLICATIONS

Kumar et al. Modelling RF Power Amplifier to Study its NonLinear Effects on RF Communication System, International Journal of Next-Generation Networks, Vil. 2, No. 4, Dec. 2010 (Year: 2010).*

The International Search Report and the Written Opinion of the International Searching Authority for International Application No. PCT/US2022/043012, Date of Mailing: Dec. 29, 2022, 9 Pages.

* cited by examiner

200

600

MICROELECTROMECHANICAL SYSTEMS (MEMS) RECTIFIER AND STORAGE ELEMENT FOR ENERGY HARVESTING

CROSS-REFERENCE TO RELATED APPLICATIONS

The present application is a continuation of U.S. patent application Ser. No. 17/901,988, filed Sep. 2, 2022, which claims the benefit of the filing date of U.S. Provisional Application No. 63/273,525, filed Oct. 29, 2021, the entire disclosures of which are incorporated by reference herein.

BACKGROUND

The Internet of Things (IoT) is the inter-networking of physical objects, such as products, packages, vehicles, buildings, etc., that are embedded with electronic components for network connectivity. The embedded components enable objects to detect others, be detected by others, collect data and/or transmit data. In some examples, the embedded components may include tags or labels attached to the physical objects. These tags or labels may be passive or active. The inter-networking capabilities may be leveraged for tracking locations of physical objects.

BRIEF SUMMARY

Aspects of the disclosure provide for an electronic device that includes a microelectromechanical system (MEMS) rectifier. The MEMS rectifier includes a mainboard having one or more radiofrequency (RF) inputs configured to receive an RF signal; and a first electrical contact. The MEMS rectifier also includes a sub-board positioned parallel to the mainboard with a gap in-between. The sub-board has a thin film piezoelectric layer; a second electrical contact positioned opposite the first electrical contact; and a ground plane. The sub-board is configured to vibrate as the RF signal is received at the one or more RF inputs, and the thin film piezoelectric layer is configured to generate energy due to the vibration and piezoelectric properties of the thin film piezoelectric layer.

In one example, the electronic device also includes an energy storage device that is configured to receive and store the generated energy. In this example, the energy storage device optionally includes one or more capacitors. In another example, the generated energy is configured to flow from the second electrical contact to the first electrical contact when the vibration of the sub-board causes the second electrical contact to come into contact with the first electrical contact. In this example, a separate electronic device is optionally connected to the first electrical contact and is configured to receive electric charge from the MEMS rectifier via the first electrical contact.

In a further example, the sub-board is configured to vibrate at a resonant frequency within a particular frequency band, and the RF signal is also within the particular frequency band. In yet another example, the gap is packaged in vacuum. In a still further example, the MEMS rectifier is in a chip with monolithic integration of piezoelectric materials, electrostatic MEMS, and solid state components.

Other aspects of the disclosure provide for a method of harvesting radiofrequency (RF) energy. The method includes receiving, by one or more RF inputs of a microelectromechanical system (MEMS) rectifier, a RF signal; vibrating a sub-board of the MEMS rectifier as the RF signal is received by the one or more RF inputs, the sub-board including piezoelectric materials; generating energy due to the vibration of the sub-board and properties of the piezoelectric materials; and storing the generated energy.

In one example, the storing of the generated energy is in a mechanical domain. In another example, the storing of the generated energy is in an energy storage device. In this example, the energy storage device optionally includes one or more capacitors.

In a further example, the method also includes causing a second electrical contact on the sub-board to come into contact with a first electrical contact on a mainboard of the MEMS rectifier using the vibration of the sub-board, wherein the mainboard is positioned parallel to the sub-board with a gap in-between; and upon contact of the second electrical contact with the first electrical contact, generating a current using the generated energy. In this example, the causing the second electrical contact to come into contact with the first electrical contact optionally includes increasing an amplitude of the vibration of the sub-board. Also in this example, the method also optionally includes powering an electronic device using the generated current. Further in this example, the method also optionally includes processing the generated current to accumulate charge before powering the electronic device. Also in this example, the method also optionally includes processing the generated current to meet requirements for powering the electronic device.

Further aspects of the disclosure provide for a method of manufacturing a microelectromechanical system (MEMS) rectifier. The method includes mounting a first electrical contact and one or more radiofrequency (RF) inputs onto a mainboard; mounting a second electrical contact to a sub-board, the sub-board including a ground plane; attaching the sub-board to the mainboard with a gap in-between in a position where the second electrical contact is opposite the first electrical contact across the gap and the sub-board is parallel to the mainboard.

In one example, the attaching of the sub-board to the mainboard includes configuring the sub-board to vibrate at a resonant frequency within a frequency band. In another example, the method also includes fabricating at least a portion of the sub-board or the mainboard using an integrated circuit manufacturing process.

DETAILED DESCRIPTION

Overview

Figure 1A:
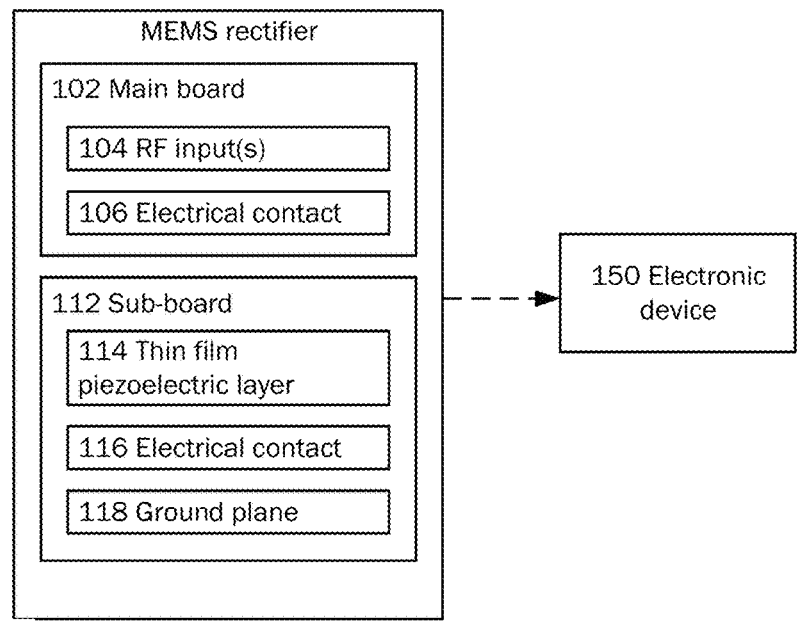
FIG. 1A is a functional diagram of a microelectromechanical system rectifier in accordance with aspects of the disclosure.

The technology relates to a rectifier for radiofrequency (RF) energy. The rectifier may include a microelectromechanical system (MEMS) resonator configured to vibrate in response to RF modulation frequencies. Using piezoelectric materials, the non-linearity of electrostatic force may be used to rectify captured RF signals. This mechanical capture of energy may be more sensitive than using diodes or other solid-state technologies. As a result, using piezoelectric RF energy harvesting in addition to or instead of using solid-state technologies, lower levels of RF energy in the environment may be captured and stored than using solid-state electronics alone.

The rectifier may include a mainboard including one or more RF inputs and a first electrical contact. The one or more RF inputs may be configured to receive an RF signal, such as from an antenna. The RF signal may be in a particular frequency band. For example, the RF signal may include 750, 850, or 1900 MHz cellular bands, 900 MHZ, 2.4 or 5 GHz ISM bands, and/or 3.5 or 6 GHz AFC bands. The rectifier may also include a sub-board positioned parallel to the mainboard with a small gap in between. The sub-board may be secured in position using a first anchor at a first end and a second anchor at a second end. The sub-board may include a thin film piezoelectric layer, a second electrical contact, and a ground plane. The thin film piezoelectric layer may include crystalline aluminum nitride (AlN) and/or other materials that have piezoelectric properties. Dimensions of the sub-board may be configured based on the particular frequency band to be captured. In some examples, the sub-board may include a different material than AlN that has piezoelectric properties. The second electrical contact may be positioned opposite the first electrical contact. The small gap between the mainboard and the sub-board may be a vacuum or filled with a finite amount of air.

As the RF signal is received by the one or more RF inputs, the sub-board is configured to vibrate at a resonant frequency. In particular, the dimensions, materials, and other features of the sub-board may be configured to allow the sub-board to vibrate at a resonant frequency in the particular frequency band. The vibration of the sub-board can increase in amplitude over time as the RF signal is received.

Energy may be generated due to the vibration and the piezoelectric properties of AlN. The generated energy may be stored and accumulated in a mechanical domain, in the form of vibration of the board (e.g., in an amplitude of the vibration). Alternatively, the generated energy may be stored and accumulated in an energy storage device, such as one or more capacitors.

Energy may be accumulated until an amplitude for the vibration allows the second electrical contact to contact the first electrical contact. Upon contact between the first and second electrical contacts, electric charge may flow from the second electrical contact to the first electrical contact, generating a current.

The first electrical contact may be connected to an electronic device. The generated current may therefore flow from the first electrical contact to the electronic device to power the electronic device. In some cases, the connection between the electrical contact and the electronic device may include an energy storage device, such as one or more capacitors, to accumulate charge before powering the electronic device. Also in some cases, the connection may include a transformer or a filter configured to prepare the current to meet the requirements for powering the electronic device. In some examples, the rectifier may be integrated with the transformer or filter in a single component.

The MEMS rectifier described herein is able to capture very low levels of RF energy in an environment. The increased sensitivity provided by the MEMS resonator may allow for capturing more energy at a more efficient rate. When used in connection with a tracking system, this MEMS rectifier allows for more consistent powering of tracking system components in areas that have lower levels of energy in an environment. In addition, as the energy harvesting function may be relegated at least partially to the MEMS rectifier, the form of the components of the tracking system becomes more flexible. The MEMS rectifier may provide access to minute amounts of energy available, which can also be used in parallel with semiconducting rectifiers that only work at higher incident power levels to form an overall system that captures a wider amount of energy at a range of efficiencies.

Example Systems

Figure 1B:
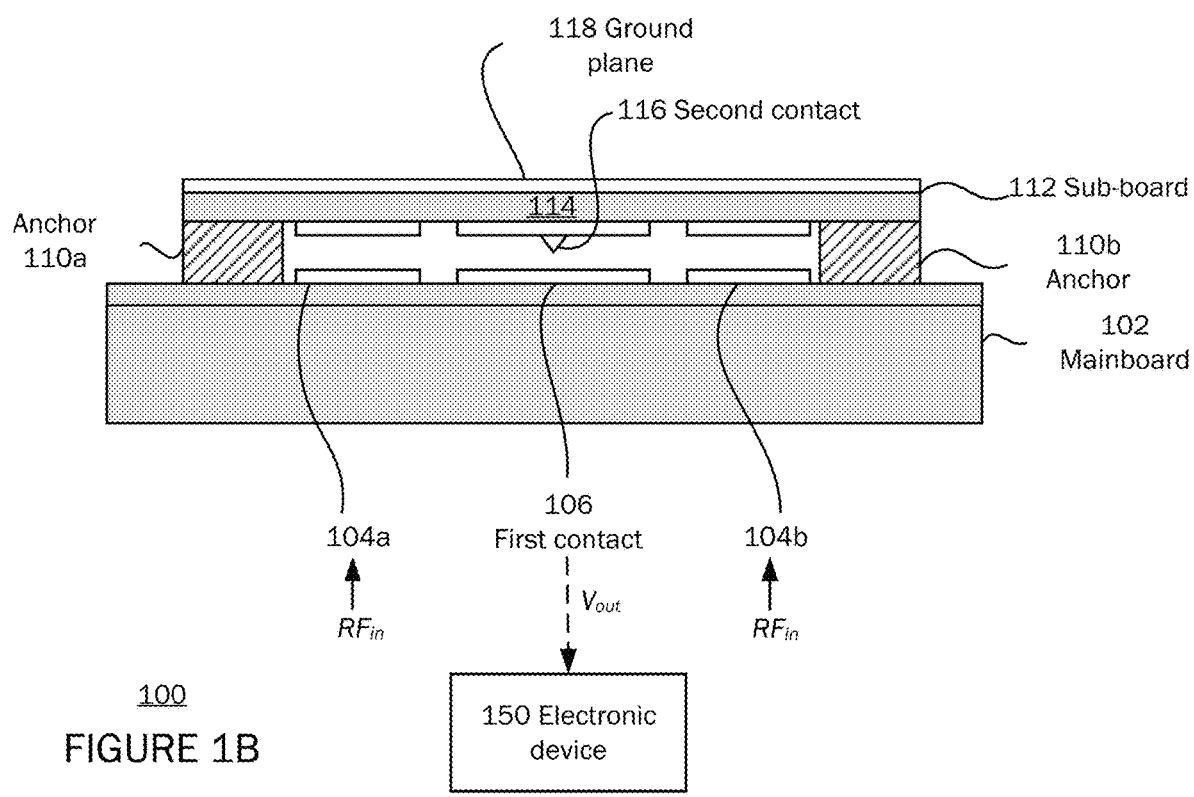
FIG. 1B is a pictorial diagram of a microelectromechanical system rectifier in accordance with aspects of the disclosure.

FIGS. 1A and 1B are functional and pictorial diagrams of a MEMS rectifier 100. The rectifier 100 includes a mainboard 102 including one or more RF inputs 104 and a first electrical contact 106. The one or more RF inputs 104 may be configured to receive an RF signal, such as from an antenna. The one or more RF inputs 104 may be configured to receive the RF signal having a particular frequency band. For example, the particular frequency band may include 750, 800-1000, or 1900, MHz cellular bands, 2.4 or 5 GHz ISM bands, and/or 3.5 or 6 GHz AFC bands. When the RF signal has a frequency in the particular frequency band, the rectifier 100 may vibrate to generate an electrical current as described herein. The first electrical contact 106 may be connected to an electronic device 150 and may be configured to output an electrical current from the rectifier 100 to the electronic device 150.

The rectifier 100 also includes a sub-board 112 positioned parallel to the mainboard 102 with a small gap in between. The sub-board 112 is secured in position using a first anchor 110a at a first end and a second anchor 110b at a second end. The sub-board 112 includes thin film crystalline aluminum nitride (AlN) 114, which has piezoelectric properties, a second electrical contact 116, and a ground plane 118. Dimensions of the sub-board 112 may be configured based on the particular frequency band to be captured. In some examples, the sub-board may include a different material than AlN that has piezoelectric properties. The second electrical contact 116 is positioned opposite the first electrical contact 106.

The first electrical contact 106 and the second electrical contact 116 may be a raised portion on the mainboard 102 and sub-board 112, respectively. The raised portion may be a sharp contact point. The raised portion may be formed using a combination of self-terminating etch into a small opening in a mask layer, followed by the top layer being deposited. Other known methods of forming a raised electrical contact on a board may be used in addition or in the alternative to this combination.

The gap between the second electrical contact 116 and the first electrical contact 106 may be minimized such that a lower threshold of RF energy is needed for actuation that results in contact between the electrical contacts. For example, the gap between the contacts or between the sub-board and the mainboard may be 5 nm, 100 nm, or any measurement in between. The size of the gap may be formed or adjusted using thin film technologies such as LPCVD films, or ALD films. The small gap between the mainboard and the sub-board may be a vacuum or air-filled. When the small gap is a vacuum, the rectifier 100 may be able to achieve a higher quality factor resonance, which increases the efficiency of rectification.

Figure 1C:
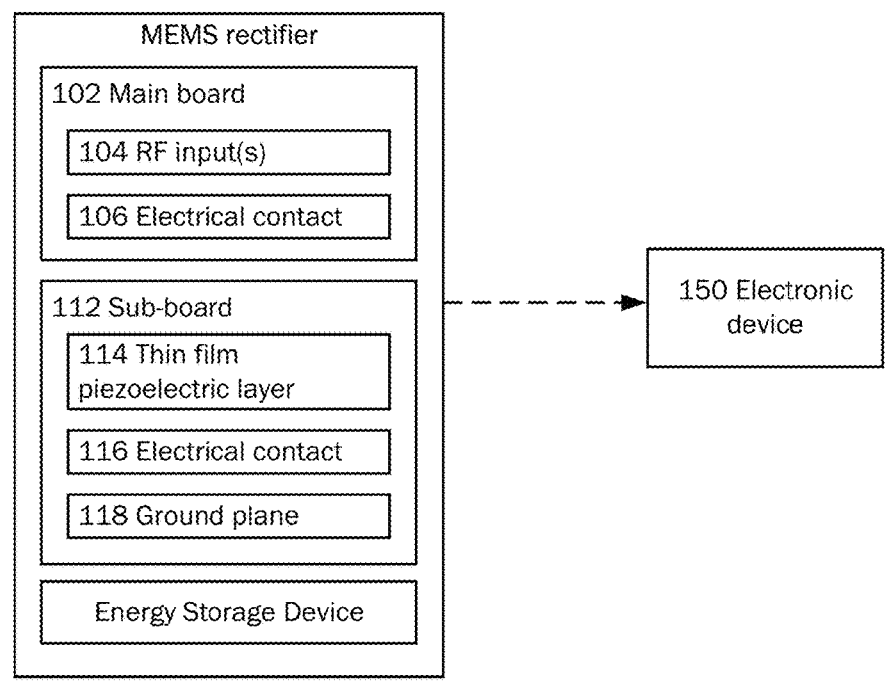
FIG. 1C is a functional diagram of a microelectromechanical system rectifier in accordance with aspects of the disclosure.

The combination of the mainboard 102 and the sub-board 112 comprises a resonator portion of the rectifier 100. For example, the sub-board 112 is configured to vibrate at a resonant frequency in response to the RF signal received by the one or more RF inputs. In particular, the sub-board 112 may have the dimensions, materials, and other features that allow the sub-board 112 to vibrate at a resonant frequency in the particular frequency band. The vibration of the sub-board 112 can increase in amplitude over time as the RF signal is received. Due to the piezoelectric properties of the material in the sub-board 112, energy may be generated from the vibration of the sub-board 112. The generated energy may be stored and accumulated in the mechanical domain, such as in an amplitude of the vibration. Alternatively, the rectifier 100 may include an energy storage device (see FIG. 1C), such as one or more capacitors, that is configured to receive and store the generated energy from the vibration of the sub-board 112. In some implementations, the rectifier 100 described above may be included in a monolithic chip. In other implementations, a multi-chip module may be created using a plurality of rectifiers.

Figure 1D:
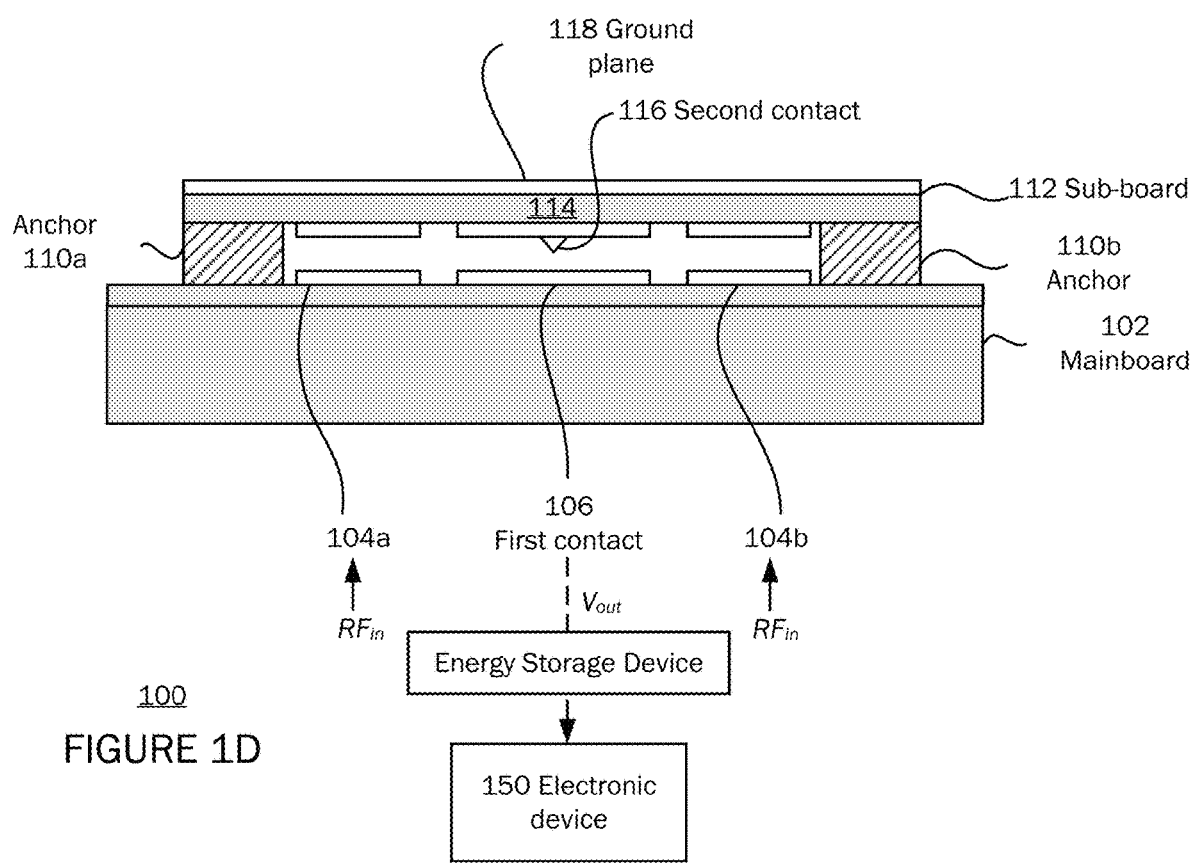
FIG. 1D is a pictorial diagram of a microelectromechanical system rectifier in accordance with aspects of the disclosure.
Figure 1E:
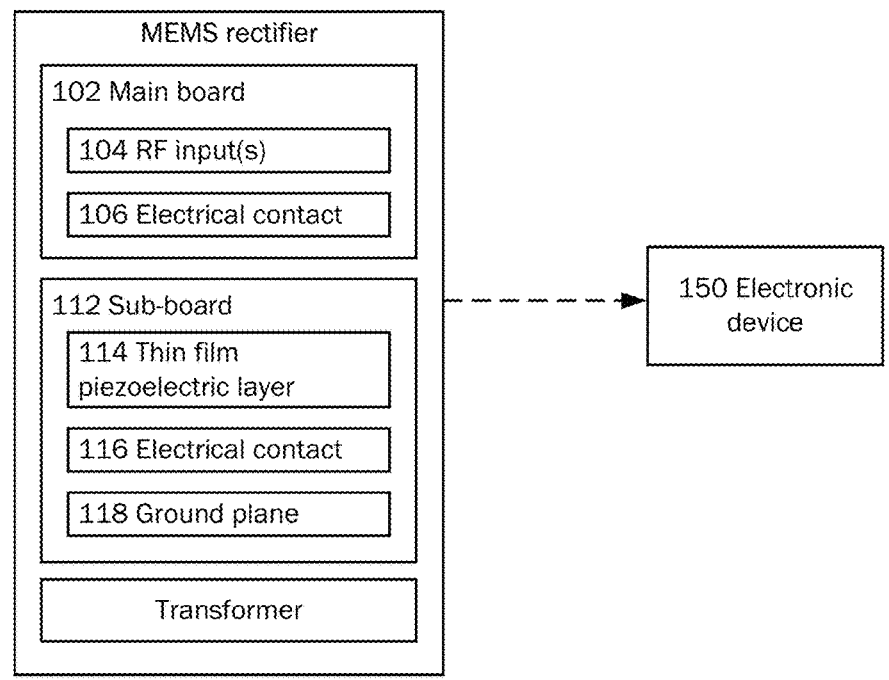
FIG. 1E is a functional diagram of a microelectromechanical system rectifier in accordance with aspects of the disclosure.
Figure 1F:
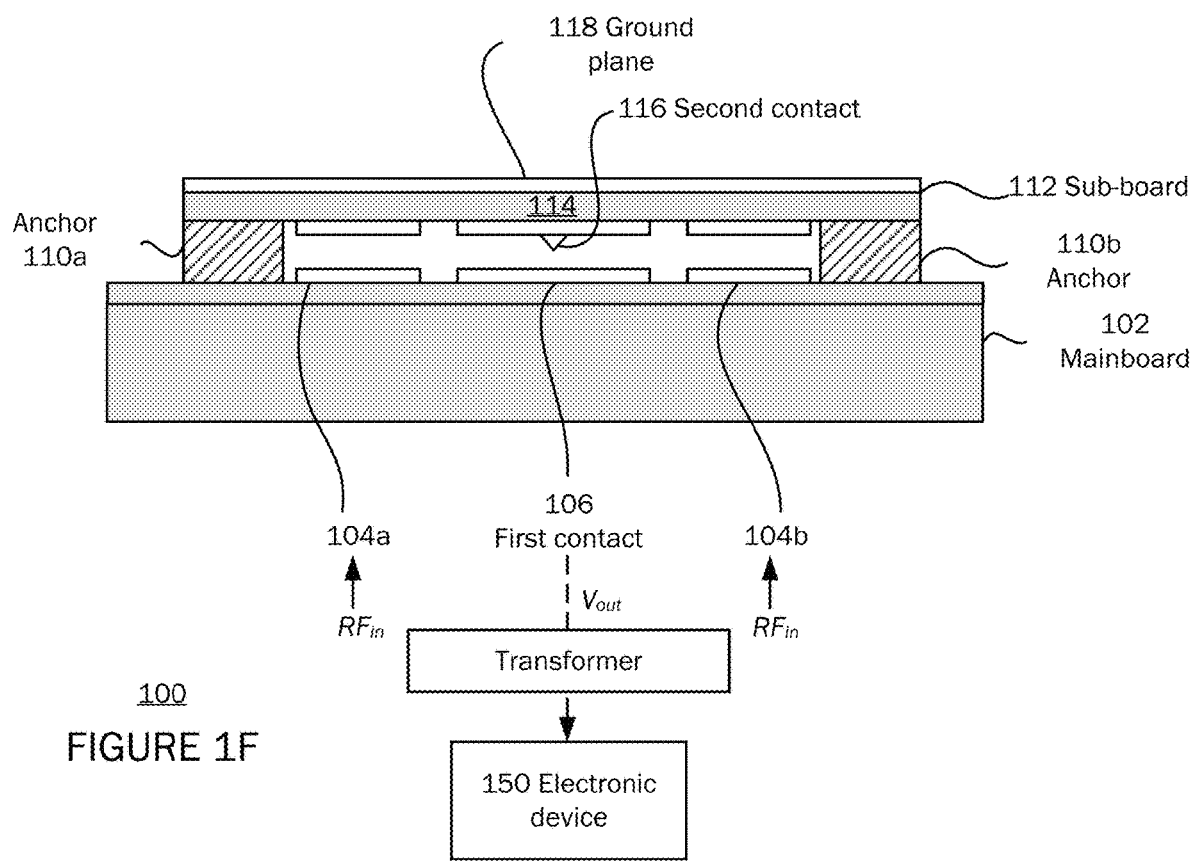
FIG. 1F is a pictorial diagram of a microelectromechanical system rectifier in accordance with aspects of the disclosure.

The sub-board 112 may be configured to accumulate energy in the mechanical domain, increasing in amplitude up to a point in which the second electrical contact 116 comes into contact with the first electrical contact 106. Upon contact between the first and second electrical contacts, electric charge may flow from the second electrical contact 116 to the first electrical contact 106, generating a current. The generated current may therefore flow from the first electrical contact 106 to an electronic device 150 connected to the first electrical contact and power the electronic device. In some cases, the connection between the first electrical contact and the electronic device may include an energy storage device (see FIG. 1D), such as one or more capacitors, to accumulate charge before powering the electronic device. Also in some cases, the connection may include a transformer or a filter configured to prepare the current to meet the requirements for powering the electronic device (see FIG. 1F). In some examples, the rectifier may be integrated with the transformer or filter in a single component (See FIG. 1E).

The lateral size of the rectifier 100 may be in the range of 5 μm-50 μm, inclusive, but may vary from this range as needed for different frequencies and situations. The rectifiers having larger widths will have lower spring constants than smaller widths owing to the lower flexural stiffness (or lower rigidity). The wider rectifiers may enable higher motion generated by the piezoelectric forces, but may be more susceptible to vibration-induced contact events between the electrical contacts due to the lower rigidity. Hence, the dimensions of the rectifier may be selected to provide a target flexural stiffness or rigidity that provides a maximum energy output, while also preventing environmental trigger events.

Figure 2:
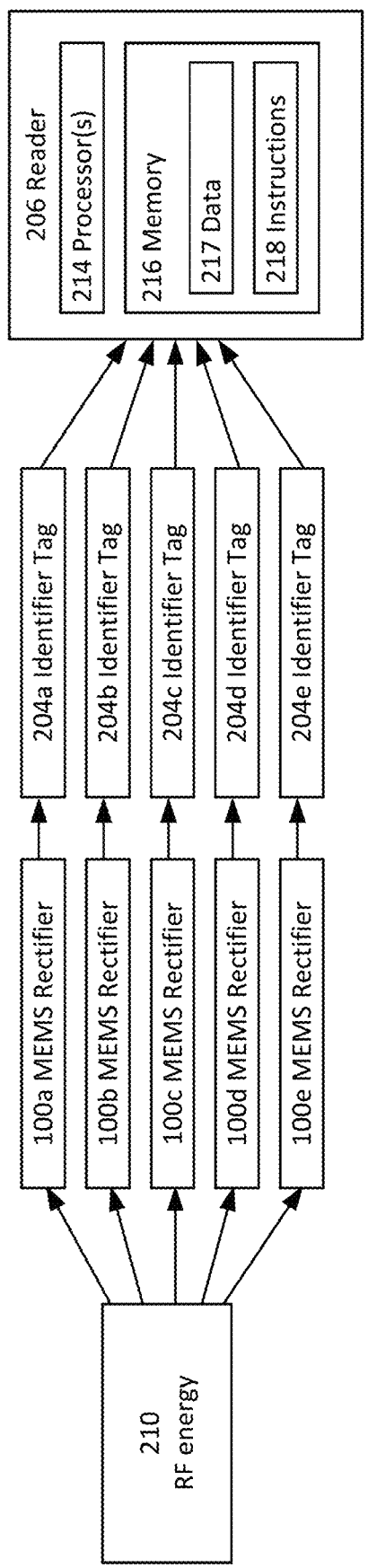
FIG. 2 is a functional diagram of an example system including a rectifier in accordance with aspects of the disclosure.

In some examples, the electronic device 150 connected to the rectifier 100 may be one or more components in a tracking system, such as tracking system 200 shown in FIG. 2. The tracking system may include electronic components such as a plurality of tracking devices, such as identifier tags or sensors, and a reader. As shown in FIGS. 2A and 2B, the tracking system 200 may include a plurality of identifier tags 204 (such as identifier chips), and a reader 206. Each identifier tag may be attached to an item to be tracked, like a package. The rectifier 100 may therefore capture RF energy 210 in the environments where the tracking system 200 is implemented and power one or more of the electronic components of the system.

After capturing energy 210 from the environment, a given rectifier 100 may transmit an electrical current to one or more identifier tags 204. As shown in FIG. 2, an electrical current is transmitted from the MEMS rectifier 100a to identifier tag 204a, from the MEMS rectifier 100b to identifier tag 204b, from MEMS rectifier 100c to identifier 204c, from MEMS rectifier 100d to identifier 204d, and from MEMS rectifier 100e to identifier 204e. When powered, the plurality of passive tags 204 may emit a signal to indicate a respective location.

The reader 206 may be a computing device configured to detect the signal emitted by the plurality of identifier tags 204, then store and/or transmit data related to the locations of the detected tags. In some implementations, the reader 206 may be connected to a MEMS rectifier to receive power. The reader 206 may include one or more processors 214, memory 216 and other components typically present in general purpose computing devices.

The one or more processors 214 may be any conventional processors, such as commercially available CPUs. Alternatively, the one or more processors may be a dedicated device such as an ASIC or other hardware-based processor, such as a field programmable gate array (FPGA). Although FIG. 2 functionally illustrates the processor(s), memory, and other elements of the reader 206 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of the reader 206. Accordingly, references to a processor or computing device will be understood to include references to a collection of processors or computing devices or memories that may or may not operate in parallel.

The memory 216 stores information accessible by the one or more processors 214, including data 217 and instructions 218 that may be executed or otherwise used by the processor(s) 214. The memory 216 may be of any type capable of storing information accessible by the processor(s), including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The data 217 may be retrieved, stored or modified by processor(s) 214 in accordance with the instructions 218. For instance, although the claimed subject matter is not limited by any particular data structure, the data may be stored in computing device registers, in a relational database as a table having a plurality of different fields and records, XML documents or flat files. The data may also be formatted in any computing device-readable format.

The instructions 218 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

Figure 3:
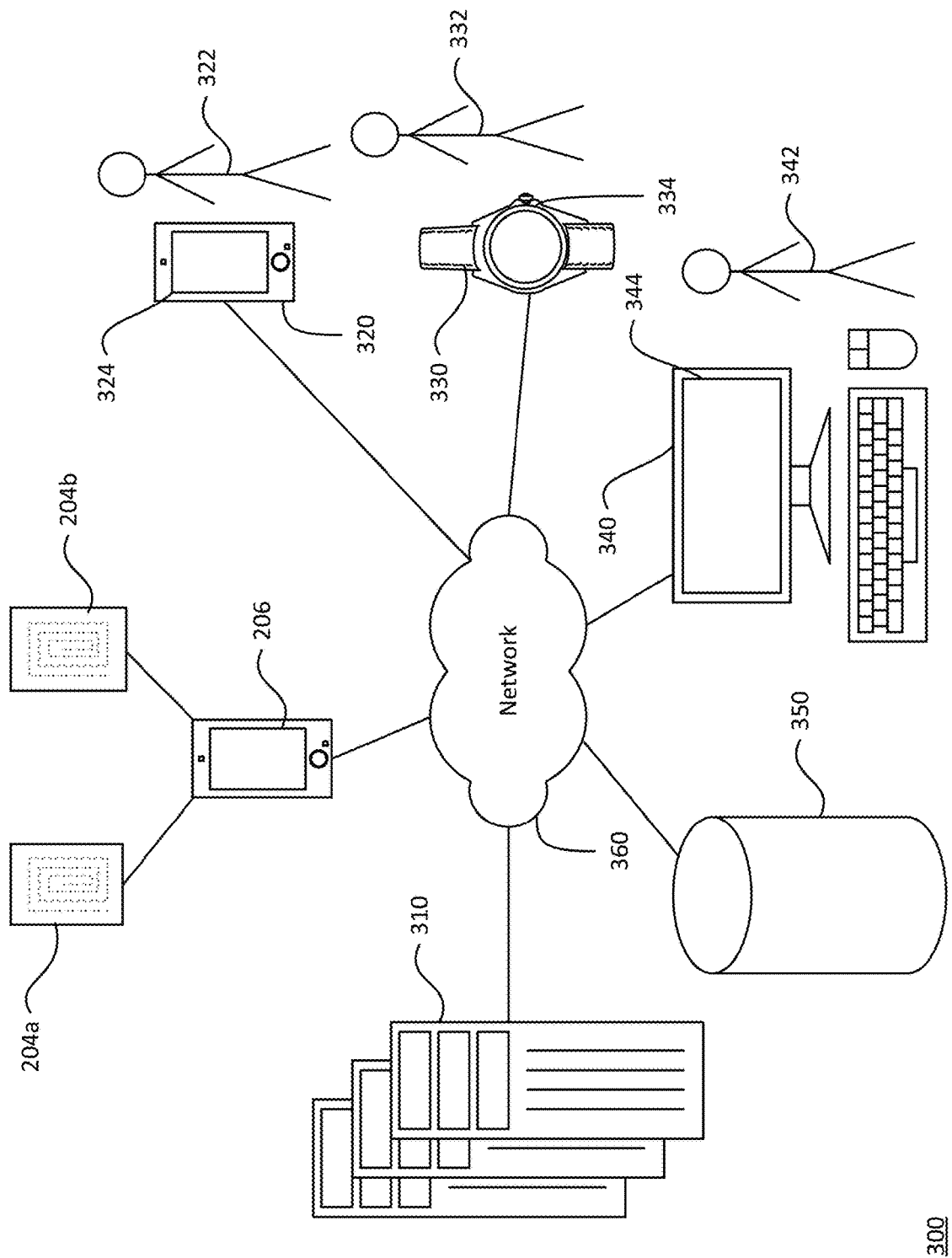
FIG. 3 is a pictorial diagram of an example network in accordance with aspects of the disclosure.
Figure 4:
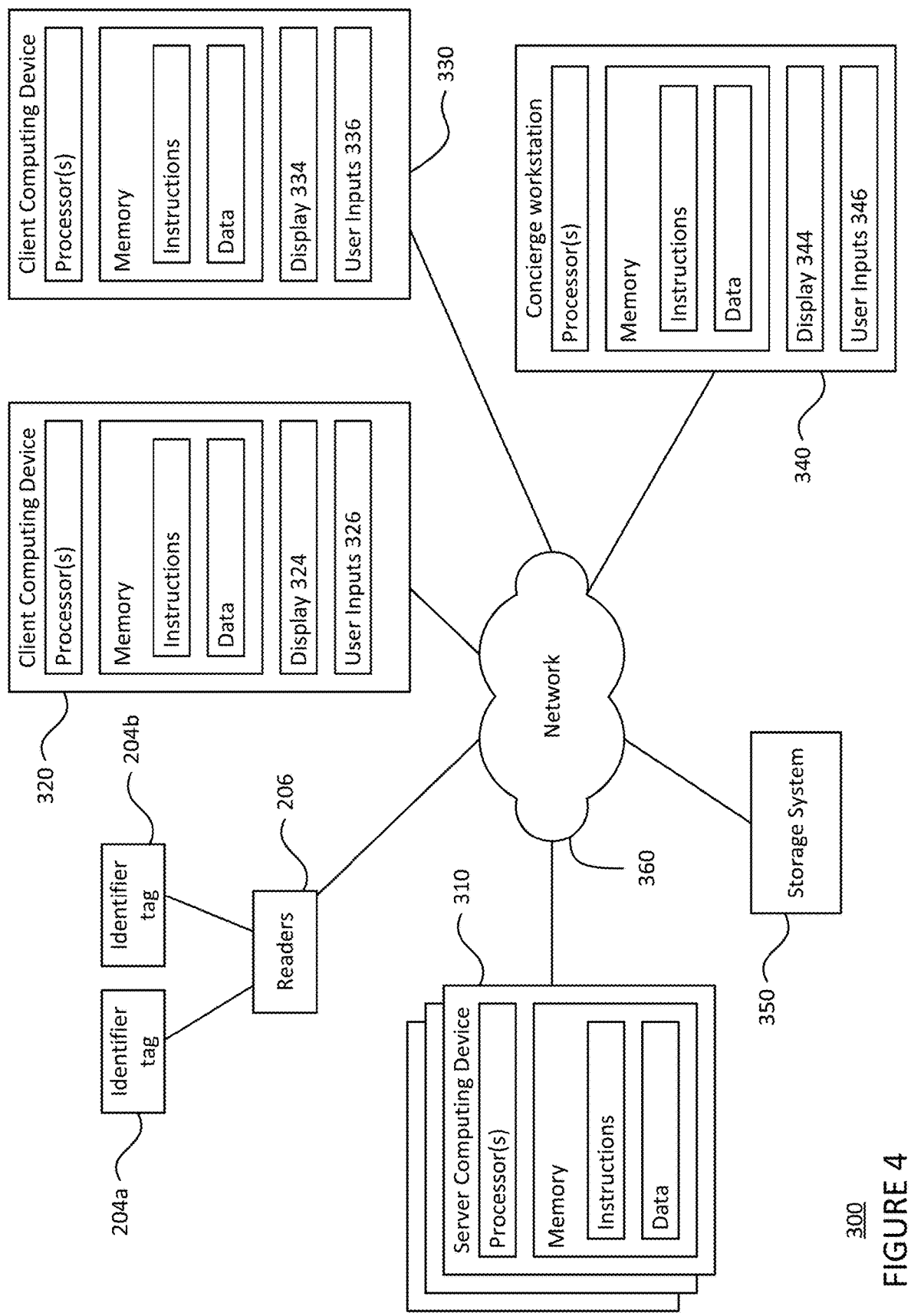
FIG. 4 is a functional diagram of the example network in FIG. 2 in accordance with aspects of the disclosure.

FIGS. 3 and 4 are pictorial and functional diagrams, respectively, of an example system 300 that includes a plurality of computing devices 310, 320, 330, 340 and a storage system 350 connected via a network 360. System 300 also includes passive tags 204a, 204b and reader 206. Although only a few tags and computing devices are depicted for simplicity, a typical system may include significantly more.

Using the client computing devices, users, such as user 322, 332, 342, may view the location data on a display, such as displays 324, 334, 344 of computing devices 320, 330, 340. As shown in FIG. 4, each client computing device 320, 330, 340 may be a personal computing device intended for use by a user 322, 332, 342, and have all of the components normally used in connection with a personal computing device including a one or more processors (e.g., a central processing unit (CPU)), memory (e.g., RAM and internal hard drives) storing data and instructions, a display such as displays 324, 334, 344 (e.g., a monitor having a screen, a touch-screen, a projector, a television, or other device that is operable to display information), and user input devices 326, 336, 346 (e.g., a mouse, keyboard, touch screen or microphone). The client computing devices may also include speakers, a network interface device, and all of the components used for connecting these elements to one another.

Although the client computing devices 320, 330, and 340 may each comprise a full-sized personal computing device, they may alternatively comprise mobile computing devices capable of wirelessly exchanging data with a server over a network such as the Internet. By way of example only, client computing device 320 may be a mobile phone or a device such as a wireless-enabled PDA, a tablet PC, a wearable computing device or system, or a netbook that is capable of obtaining information via the Internet or other networks. In another example, client computing device 330 may be a wearable computing system, shown as a wristwatch in FIG. 3. As an example, the user may input information using a small keyboard, a keypad, microphone, using visual signals with a camera, or a touch screen.

Example Methods

In addition to the operations described above and illustrated in the figures, various operations will now be described. It should be understood that the following operations do not have to be performed in the precise order described below.

Figure 5:
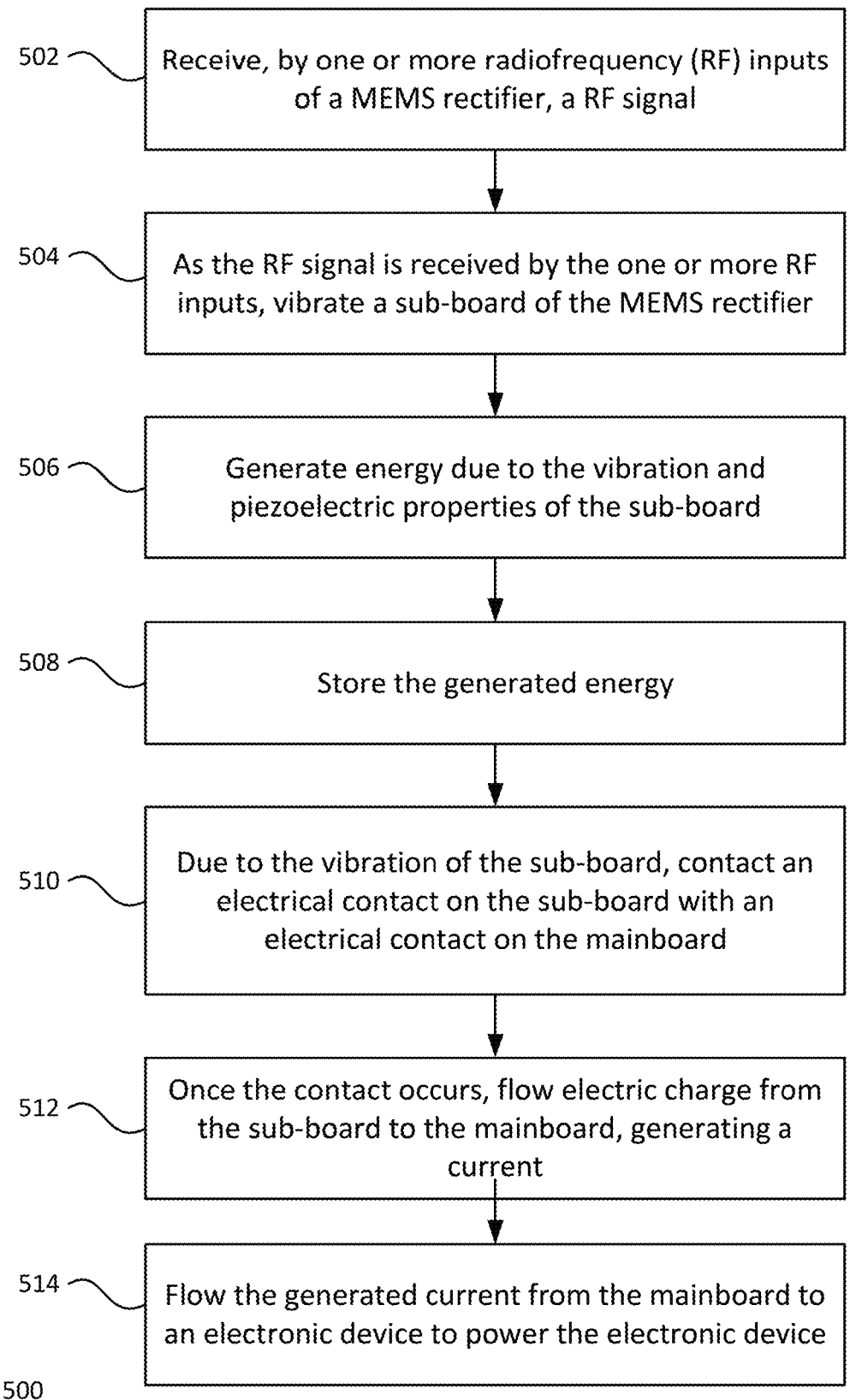
FIG. 5 is a flow diagram of an example method in accordance with aspects of the disclosure.

FIG. 5 is an example flow diagram 500 including a method of operation for a MEMS rectifier in accordance with some of the aspects described above. While FIG. 5 shows blocks in a particular order, the order may be varied and that multiple operations may be performed simultaneously. Also, operations may be added or omitted.

At block 502, a RF signal is received by one or more RF inputs 104 of the MEMS rectifier 100. At block 504, as the RF signal is received by the one or more RF inputs, a sub-board 112 of the MEMS rectifier 100 vibrates. In some cases, the RF signal is in a particular frequency band that causes the sub-board 112 to vibrate at a particular resonant frequency. The vibration of the sub-board 112 may increase in amplitude over time as the RF signal is received. At block 506, energy is generated due to the vibration and the piezoelectric properties of the sub-board 112. At block 508, the generated energy is stored. The energy may be stored in a mechanical domain, such as in an amplitude of the vibration, or in an energy storage device, such as one or more capacitors.

At block 510, an electrical contact on the sub-board 112 comes into contact with an electrical contact on a mainboard 102 due to the vibration of the sub-board 112. The mainboard 102 is positioned substantially parallel to the sub-board 112 with a gap between the mainboard 102 and the sub-board 112. The contact between the two electrical contacts may occur when an amplitude of the vibrating sub-board 112 is able to span the gap between the mainboard 102 and the sub-board 112. At block 512, once the contact between the electrical contacts occurs, electric charge may flow from the sub-board to the mainboard, generating a current.

At block 514, the generated current may flow from the mainboard 102 to an electronic device 150 to power the electronic device 150. As the generated current flows from the mainboard 102 to the electronic device 150, the current may flow through one or more electronic components to prepare the current to meet the requirements for powering the device. For example, the one or more electronic components may include an energy storage device, such as one or more capacitors, to accumulate charge before powering the electronic device, or a transformer or a filter to modify the current. In some examples, the rectifier may be integrated with the transformer or filter in a single component. Once powered, the electronic device 150 may perform a function; for example, an identifier tag, when powered, may emit a signal.

Figure 6:
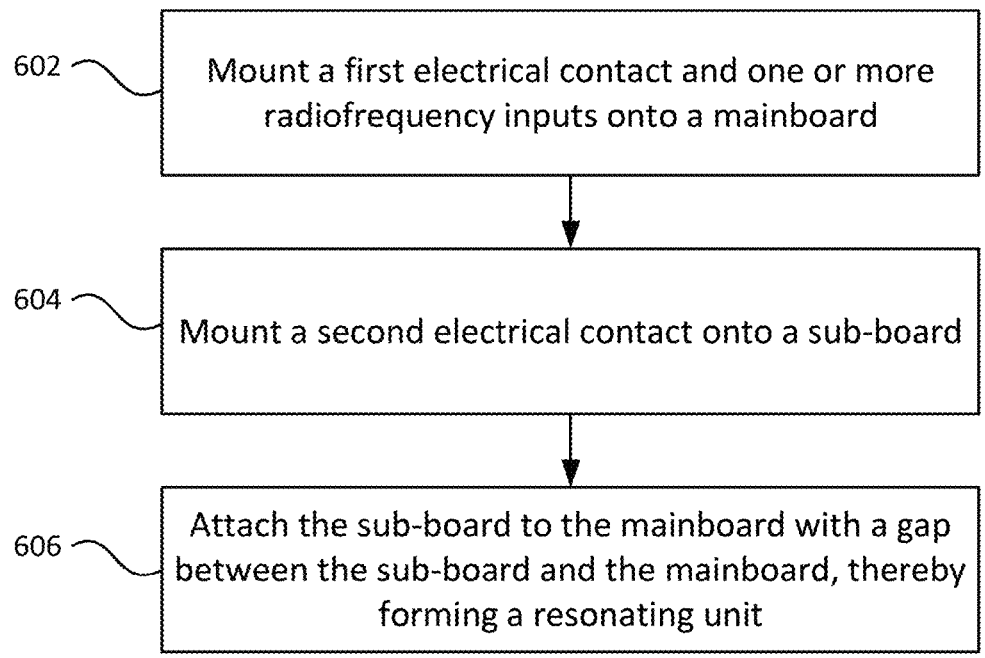
FIG. 6 is a flow diagram of another example method in accordance with aspects of the disclosure.

FIG. 6 is an example flow diagram 600 including a method for manufacturing a MEMS rectifier in accordance with some of the aspects described above. The method may be performed by one or more computing devices controlling machinery that is customized for the steps of the method. While FIG. 6 shows blocks in a particular order, the order may be varied and that multiple operations may be performed simultaneously. Also, operations may be added or omitted.

At block 602, a first electrical contact 106 and one or more RF inputs 104 may be mounted onto a mainboard 102. At block 604, a second electrical contact 116 may be mounted to a sub-board 112. The sub-board 112 may include a ground plane 118. At block 606, the sub-board 112 may be attached to the mainboard 102 with a gap between the sub-board 112 and the mainboard 102, thereby forming a resonating unit. The position of the attached sub-board may include the second electrical contact 116 being directly across the gap from the first electrical contact 106, such that at least a portion of the second contact is located at the point on the sub-board that is the shortest distance from the first contact 106. When attached, the sub-board 112 may be substantially parallel to the mainboard 102. The sub-board 112 may be attached using one or more anchors 110. In some implementations, at least a portion of the mainboard 102 or the sub-board 112 is fabricated using the integrated circuit manufacturing portion. Alternatively, the MEMS rectifier described herein, such as MEMS rectifier 100, may be manufactured as an integrated circuit or monolithic chip using steps included in the integrated circuit manufacturing process. The monolithic chip may include an integration of the piezoelectric components, electrostatic components, and solid state components. For example, piezoelectric materials, such as AlN, electrostatic circuitry, such as traces or other parts of the MEMS, and CMOS circuitry or electronics, such as semiconductors, may be integrated in a chip to form the rectifier 100.

The MEMS rectifier described herein is able to capture very low levels of RF energy in an environment. The increased sensitivity provided by the MEMS resonator may allow for capturing more energy at a more efficient rate. When used in connection with a tracking system, this MEMS rectifier allows for more consistent powering of tracking system components in areas that have lower levels of energy in an environment. In addition, as the energy harvesting function may be relegated at least partially to the MEMS rectifier, the form of the components of the tracking system becomes more flexible.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. An electronic device comprising a microelectromechanical system (MEMS) device, the MEMS device including:
    a board including:
        a thin film piezoelectric layer;
        an electrical contact; and
        a ground plane;
        wherein the board is configured to vibrate in response to a radiofrequency (RF) signal;
        wherein the board is configured to generate energy for the electronic device due to the vibration and piezoelectric properties of the thin film piezoelectric layer; and
        wherein the electrical contact is configured to allow for flow of electric charge of the generated energy to other one or more other portions of the electronic device.
2. The electronic device of claim 1, wherein the electrical contact is a raised portion of the board.
3. The electronic device of claim 1, wherein the RF signal is within a particular frequency band and wherein the board is configured to vibrate at a resonant frequency within the particular frequency band.
4. The electronic device of claim 3, wherein one or more dimensions of the board are selected based on the particular frequency band.
5. The electronic device of claim 1, further comprising an energy storage device that is configured to receive and store the generated energy.
6. The electronic device of claim 5, wherein the energy storage device includes one or more capacitors configured to receive and store charge corresponding to the generated energy.
7. The electronic device of claim 1, further comprising a monolithic chip, wherein the MEMS rectifier device is included in the monolithic chip.
8. The electronic device of claim 1, wherein the generated energy is mechanical energy.
9. The electronic device of claim 1, wherein the generated energy is configured to be stored in the mechanical domain.
10. The electronic device of claim 9, wherein the generated energy in the form of vibration of the board.
11. The electronic device of claim 1, further comprising one or more RF inputs operatively connected to the board and configured to receive the RF signal.
12. The electronic device of claim 11, wherein the vibration of the board increases in amplitude over time when the RF signal is received by the one or more RF inputs.
13. The electronic device of claim 1, wherein the RF signal includes at least one of i) a cellular band, ii) an industrial, scientific, and medical (ISM) band, iii) a 3.5 GHz band or iv) a 6 GHz band.
14. The electronic device of claim 1, wherein the thin film piezoelectric layer includes crystalline aluminum nitride (AlN).
15. The electronic device of claim 1, further comprising a transformer operatively connected to the board and configured to prepare the generated current to meet requirements for powering the electronic device.
16. The electronic device of claim 1, wherein a lateral size of the MEMS device is in the range of 5 μm-50 μm.
17. A tracking system, the tracking system comprising:
    one or more identifier tags configured to emit a signal to indicate a location, wherein the one or more identifier tags are operatively connected to the electronic device of claim 1; and
    one or more readers configured to detect a signal emitted by the one or more identifier tags, the one or more readers including:
        one or more processors, and
        a memory operatively coupled to the one or more processors.
18. The tracking system of claim 17, further comprising one or more client computing devices configured to display location data.
19. The tracking system of claim 17, further comprising a server computing device, the server computing device including one or more processors and a memory.
20. The tracking system of claim 17, wherein the electronic device of claim 1 is a plurality of electronic devices of claim 1 included in a multi-chip module.

* * * * *

UNITED STATES PATENT AND TRADEMARK OFFICE
CERTIFICATE OF CORRECTION

PATENT NO. : 12,325,626 B2
APPLICATION NO. : 18/514346
DATED : June 10, 2025
INVENTOR(S) : Amit Lal Page 1 of 1

It is certified that error appears in the above-identified patent and that said Letters Patent is hereby corrected as shown below:

In the Claims

Claim 7
Column 10, Line 16:
Now reads: "MEMS rectifier device"; should read -- MEMS device --

Signed and Sealed this
Twenty-second Day of July, 2025

Coke Morgan Stewart
*Acting Director of the United States Patent and Trademark Office*